United States Patent
Yarragunta et al.

(10) Patent No.: US 12,402,242 B2
(45) Date of Patent: Aug. 26, 2025

(54) MEMORY SUB-SYSTEM ENCLOSURE

(71) Applicant: Micron Technology, Inc., Boise, ID (US)

(72) Inventors: Suresh Reddy Yarragunta, Bangalore (IN); Deepu Narasimiah Subhash, Yeshwanthpu (IN); Ravi Kumar Kollipara, Puppalaguda (IN)

(73) Assignee: Micron Technology, Inc., Boise, ID (US)

( * ) Notice: Subject to any disclaimer, the term of this patent is extended or adjusted under 35 U.S.C. 154(b) by 159 days.

(21) Appl. No.: 18/204,704

(22) Filed: Jun. 1, 2023

(65) Prior Publication Data

US 2024/0107657 A1   Mar. 28, 2024

(30) Foreign Application Priority Data

Sep. 28, 2022 (IN) .............................. 202241055639

(51) Int. Cl.
  *H05K 1/02* (2006.01)
  *H05K 7/20* (2006.01)
(52) U.S. Cl.
  CPC ....... *H05K 1/0209* (2013.01); *H05K 7/20509* (2013.01); *H05K 2201/066* (2013.01); *H05K 2201/10159* (2013.01)
(58) Field of Classification Search
  None
  See application file for complete search history.

(56) References Cited

U.S. PATENT DOCUMENTS

| | | | |
|---|---|---|---|
| 5,883,782 A * | 3/1999 | Thurston | H01L 23/4006 361/720 |
| 7,174,628 B1 | 2/2007 | Wang et al. | |
| 10,354,938 B2 * | 7/2019 | Bilan | F21V 29/76 |

(Continued)

FOREIGN PATENT DOCUMENTS

| KR | 20210152914 | 12/2021 |
|---|---|---|
| WO | 2023147156 | 8/2023 |

OTHER PUBLICATIONS

"International Application Serial No. PCT US2025 018525, International Search Report mailed Jun. 18, 2025", 11 pages.

(Continued)

*Primary Examiner* — Krystal Robinson
(74) *Attorney, Agent, or Firm* — Schwegman Lundberg & Woessner, P.A.

(57) ABSTRACT

Aspects of the present disclosure are directed to a memory sub-system with isothermal cooling of components. A PCB assembly may be secured between a heat spreader and a heat sink that are thermally coupled. The heat sink radiates heat absorbed from both sides of the PCB assembly. By connecting the heat spreader to the heat sink, heat is more effectively transferred from the side of the PCB assembly not directly connected to the heat sink. The PCB assembly may be secured between a top enclosure and a bottom enclosure. The top enclosure and the bottom enclosure may be thermally coupled using a vapor chamber. The vapor chamber pumps heat from a higher-temperature side of the PCB assembly to a lower-temperature side of the PCB assembly. By using the vapor chamber to thermally couple the top and bottom enclosures, creation of hot spots is avoided.

20 Claims, 8 Drawing Sheets

(56) References Cited

U.S. PATENT DOCUMENTS

| | | | | |
|---|---|---|---|---|
| 10,674,621 | B1* | 6/2020 | Tsorng | H05K 7/20163 |
| 2004/0042178 | A1* | 3/2004 | Gektin | H01L 23/433 |
| | | | | 257/E23.09 |
| 2009/0310310 | A1 | 12/2009 | Anzai | |
| 2015/0106660 | A1* | 4/2015 | Chumbalkar | G06F 11/3058 |
| | | | | 711/104 |
| 2020/0137896 | A1* | 4/2020 | Elenitoba-Johnson | |
| | | | | G06F 13/4221 |
| 2021/0013125 | A1* | 1/2021 | North | G06F 1/206 |
| 2021/0181819 | A1* | 6/2021 | Scobee | G01R 31/2874 |
| 2021/0193558 | A1* | 6/2021 | Miele | G06F 1/183 |
| 2021/0195727 | A1* | 6/2021 | Breicher | H05K 1/0203 |
| 2022/0030748 | A1* | 1/2022 | Chang | H05K 7/20709 |
| 2023/0012108 | A1* | 1/2023 | Choi | G06F 1/203 |
| 2023/0240057 | A1* | 7/2023 | Hung | H05K 7/209 |
| | | | | 361/720 |
| 2023/0420338 | A1* | 12/2023 | Subrahmanyam | |
| | | | | H01L 23/3672 |
| 2024/0114659 | A1* | 4/2024 | Gupta | G06F 1/206 |
| 2024/0268077 | A1 | 8/2024 | Yarragunta et al. | |

OTHER PUBLICATIONS

"International Application Serial No. PCT US2025 018525, Written Opinion mailed Jun. 18, 2025", 4 pages.

* cited by examiner

MEMORY SUB-SYSTEM ENCLOSURE

PRIORITY APPLICATION

This application claims the benefit of priority to Indian Patent Application Serial Number 202241055639, filed Sep. 28, 2022, which is incorporated herein by reference in its entirety.

TECHNICAL FIELD

The present disclosure generally relates to memory sub-systems and, more specifically, to enclosures for memory sub-systems.

BACKGROUND

A memory sub-system can be a storage system, such as a solid-state drive (SSD), and can include one or more memory components that store data. The memory components can be, for example, non-volatile memory components and volatile memory components. The memory components can be affixed to a printed circuit board (PCB). In general, a host system can utilize a memory sub-system to store data at the memory components and to retrieve data from the memory components.

Executing memory access commands generates heat. If the temperature of a memory sub-system exceeds a safe operating temperature, data may be lost or the memory sub-system may be permanently damaged. The memory sub-system may include a thermal sensor to monitor the temperature of the memory sub-system. To prevent overheating, in response to detecting that the temperature has reached a predetermined threshold, the rate of processing memory access commands may be reduced. This is referred to as thermal throttling.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed to a memory sub-system with isothermal cooling of components. In some embodiments, the memory sub-system is a hybrid memory/storage sub-system. In general, a host system can utilize a memory sub-system that includes one or more memory components. The host system can provide data to be stored at the memory sub-system and can request data to be retrieved from the memory sub-system.

A PCB assembly may be secured between a heat spreader and a heat sink. The heat spreader spreads heat from high-temperature components on one side of the PCB assembly to low-temperature components and the heat spreader itself. The heat spreader is coupled to the heat sink. The heat sink radiates heat absorbed from another side of the PCB assembly and from the heat spreader. By connecting the heat spreader to the heat sink, heat is more effectively transferred from the side of the PCB assembly not directly connected to the heat sink.

An SSD may have components on both the primary and the secondary side of the PCB to efficiently utilize the PCB floor plan and balance the heat transfer to the enclosure top and bottom surfaces. However, most of the enclosure construction is not symmetric due to interface connector z-height which allows for only one side of the enclosure design to have fins. The other side will have a solid metal surface for heat transfer. Due to these construction constraints, the SSD will have unbalanced heat load on PCB and enclosure which leads to thermal challenges to work reliably within the junction temperature.

Discussed herein are methodologies and working concepts of enclosure designs to effectively transfer heat from the bottom enclosure where it experiences more power dissipation and less exchange area to the top enclosure that has heatsink fins and more heat exchange area available to improve thermal efficiency. Thus, isothermal cooling of the critical components to balance heat transfer is improved, thereby improving the components' reliability.

Furthermore, the improved heat transfer between the two sides of the PCB provides increased flexibility in design, since high-heat components may be placed on either side of the PCB.

The PCB assembly may be secured between a top enclosure and a bottom enclosure. The top enclosure and the bottom enclosure may be thermally coupled using a vapor chamber (e.g., a U-shaped titanium-based vapor chamber). The vapor chamber pumps heat from a higher-temperature side of the PCB assembly to a lower-temperature side of the PCB assembly. The top and bottom enclosure absorb heat from the PCB assembly, the vapor chamber, or both. By using the vapor chamber to thermally couple the top and bottom enclosures, heat increases the temperature of the entire enclosure more evenly, avoiding the creation of hot spots.

Figure 1:
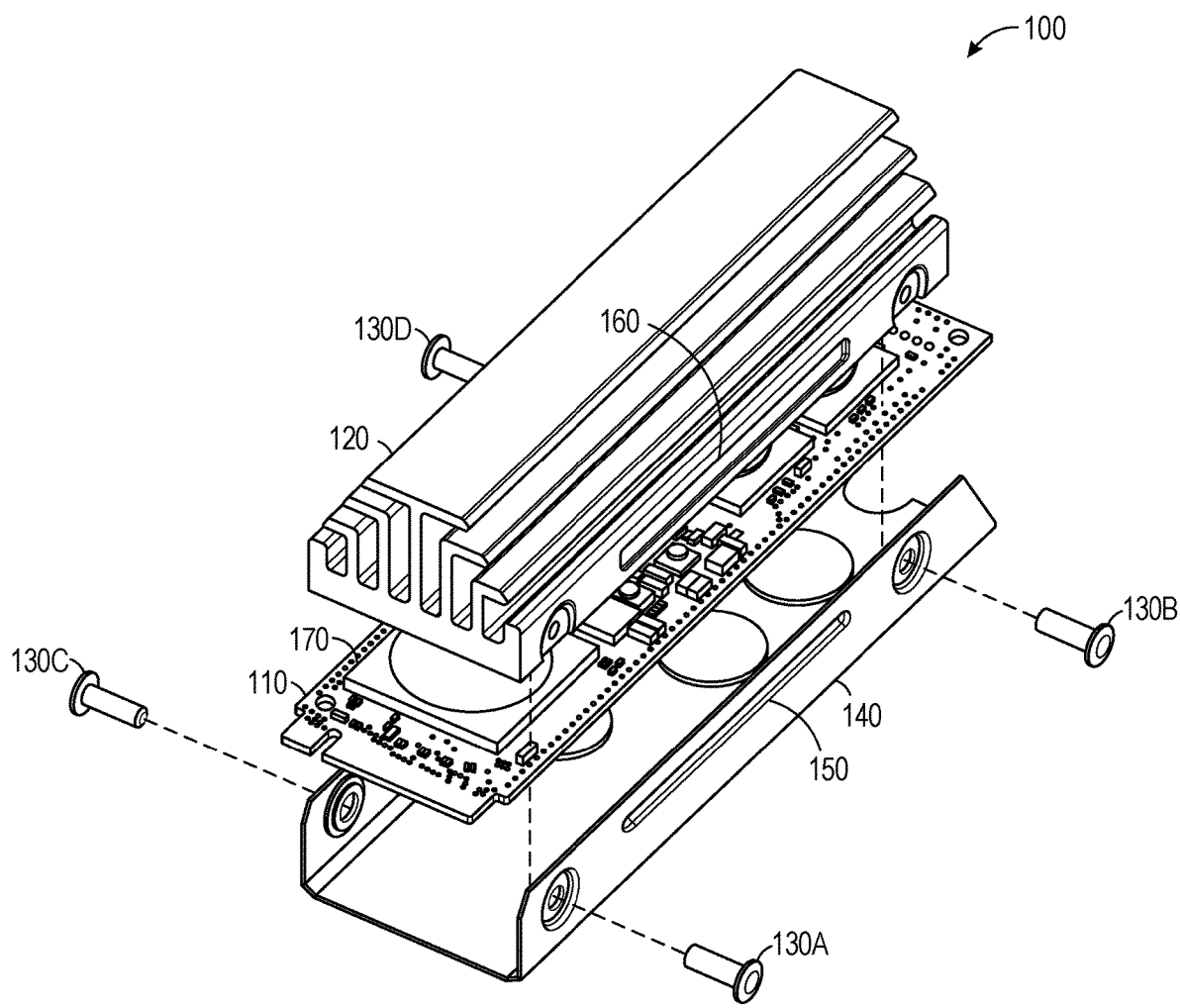
FIG. 1 illustrates an example memory sub-system in accordance with some embodiments of the present disclosure, in an exploded view.
Figure 8:
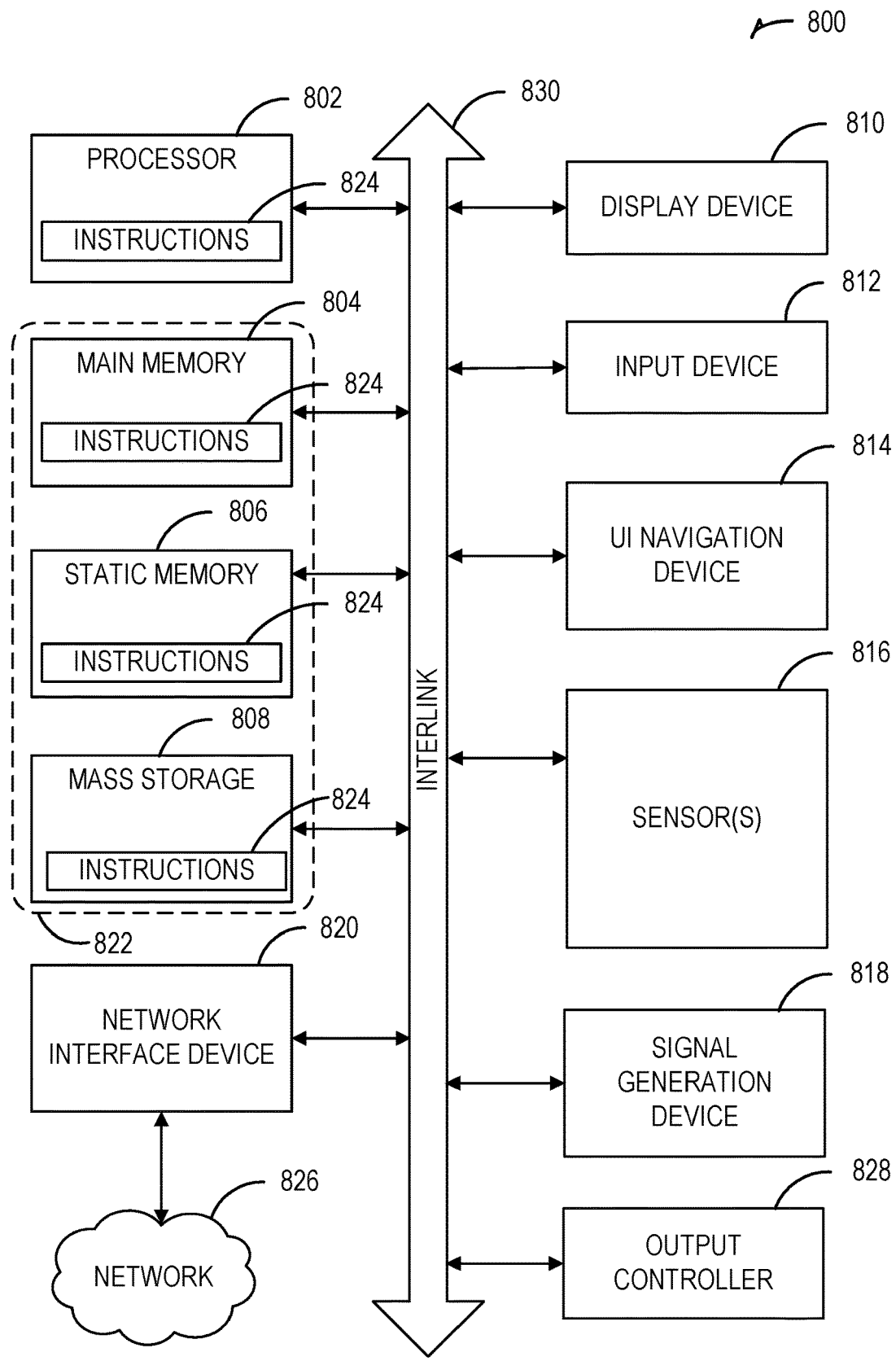
FIG. 8 illustrates an example machine of a computer system within which a set of instructions can be executed for causing the machine to perform any one or more of the methodologies discussed herein.

FIG. 1 illustrates an example memory sub-system 100 in accordance with some embodiments of the present disclosure, in an exploded view. The sub-system 100 can include memory components (e.g., memory component 170) soldered to a PCB 110. The memory components can be volatile memory components, non-volatile memory components, or a combination of such. In some embodiments, the memory sub-system 100 is a storage system. An example of a storage system is an SSD. In some embodiments, the memory sub-system 100 is a hybrid memory/storage subsystem. In general, the memory sub-system 100 may be part of or coupled to a host system that uses the memory sub-system 100. For example, the host system can write data to the memory sub-system 100 and read data from the memory sub-system 100. An example host system is shown in FIG. 8.

The host system can be a computing device such as a desktop computer, laptop computer, network server, mobile device, or such computing device that includes a memory and a processing device. The host system can include or be coupled to the memory sub-system 100 so that the host system can read data from or write data to the memory sub-system 100. The host system can be coupled to the memory sub-system 100 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system and the memory sub-system 100. The host system can further utilize an NVM Express (NVMe) interface to access the memory components when the memory sub-system 100 is coupled with the host system by the PCIe interface. The physical host interface can provide an interface for passing control, address, data, and other signals between the memory sub-system 100 and the host system.

The memory components can include any combination of the different types of non-volatile memory components and/or volatile memory components. An example of non-volatile memory components includes a negative-and (NAND) type flash memory. Each of the memory components can include one or more arrays of memory cells such as SLCs, or MLCs (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system. Although non-volatile memory components such as NAND type flash memory are described, the memory components can be based on any other type of memory such as a volatile memory. In some embodiments, the memory components can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components can be grouped as memory pages or data blocks that can refer to a unit of the memory component used to store data.

The memory-subsystem 100 may include a memory system controller (hereinafter referred to as "controller") soldered to the PCB 110. The controller can communicate with the memory components to perform operations such as reading data, writing data, or erasing data at the memory components and other such operations. The controller can include hardware such as one or more integrated circuits and/or discrete components, a buffer memory, or a combination thereof. The controller can be a microcontroller, special purpose logic circuitry (e.g., a field programmable gate array (FPGA), an application specific integrated circuit (ASIC), etc.), or other suitable processor. The controller can include a processor (processing device) configured to execute instructions stored in local memory. For example, the local memory of the controller may include an embedded memory configured to store instructions for performing various processes, operations, logic flows, and routines that control operation of the memory sub-system 100, including handling communications between the memory sub-system 100 and the host system. In some embodiments, the local memory can include memory registers storing memory pointers, fetched data, etc. The local memory can also include read-only memory (ROM) for storing micro-code. The local memory may include a logical-to-physical table for lookup of physical addresses in the memory components from logical addresses used by the host.

While the example memory sub-system 100 in FIG. 1 has been described as including the controller, in another embodiment of the present disclosure, a memory sub-system 100 may not include a controller, and may instead rely upon external control (e.g., provided by an external host, or by a processor or controller separate from the memory sub-system 100). In general, the controller can receive commands or operations from the host system and can convert the commands or operations into instructions or appropriate commands to achieve the desired access to the memory components. The controller can be responsible for other operations such as wear-leveling operations, garbage collection operations, error detection and error-correcting code (ECC) operations, encryption operations, caching operations, and address translations between a logical address and a physical address that are associated with the memory components. The controller can further include host interface circuitry to communicate with the host system via the physical host interface. The host interface circuitry can convert the commands received from the host system into command instructions to access the memory components as well as convert responses associated with the memory components into information for the host system.

The memory sub-system 100 can also include additional circuitry or components that are not illustrated. In some embodiments, the memory sub-system 100 can include a cache or buffer (e.g., DRAM) and address circuitry (e.g., a row decoder and a column decoder) that can receive a logical address from the controller and decode the logical address to one or more physical addresses at the memory components.

The memory sub-system 100 of FIG. 1 may process read requests and write requests and provide read and write responses. Generally, a write request includes a data unit to be written to the memory sub-system 100 and a logical address referring to that data unit. The memory sub-system 100 executes a write operation to write the data unit to one or more physical addresses of the memory components. For example, the write operation may be executed by the memory system controller. The write operation includes generating a logical-to-physical (L2P) entry for the data unit.

The L2P entry relates the logical address for the data unit provided with the write request to the physical address or addresses at the memory component to which the data unit is written.

Although the read operation and write operation are described herein as being executed by the memory sub-system 100 (e.g., the controller thereof), in some examples, read and write operations, as described herein, may be executed at the host system. Also, the write request and read request may originate at the host system or may be initiated at the memory sub-system 100.

When a temperature sensor reports that the temperature has reached or exceeded a predetermined threshold (e.g., 70 degrees Centigrade), the controller slows the rate at which memory operations are performed to reduce the generation of heat. Enclosing the PCB 110 between the top heatsink 120 and the bottom heat spreader 140 allows heat generated by the memory components and other components of the memory sub-system 100 to be absorbed by the enclosure. Heat transferred to the top heatsink 120 is more effectively transferred to the ambient environment by virtue of the large surface area of the heat fins of the top heatsink 120. Heat transferred to the bottom heat spreader 140 is transferred among the components of the PCB 110 and between the bottom heat spreader 140 and the top heatsink 120. The fasteners 130A, 130B, 130C, and 130D fasten the bottom heat spreader 140 to the top heatsink 120, placing the top heatsink 120 in direct contact with the heat spreader 140 and facilitating heat transfer between the two components. The fasteners 130A-130D may also conduct heat between the top heatsink 120 and the bottom heat spreader 140. The fasteners 130A-130D may be screws, rivets, or other fasteners. The fasteners 130A-130D may be configured to conduct heat between the top heatsink 120 and the bottom heat spreader 140 once in place. For example, metal screws may conduct heat once tightened. Additionally, a feature 150 (e.g., a tab) of the bottom heat spreader 140 may be in contact with a feature 160 (e.g., a slot) of the top heatsink 120, further facilitating the transfer of heat between the two components.

By interconnecting the bottom heat spreader 140 and the top heatsink 120, the amount of heat that can be generated by the memory components before thermal throttling begins is increased. The feature 150 and the feature 160 may create an interference fit between the top heatsink 120 and the bottom heat spreader 140. An interference fit is a form of fastening between two tight fitting mating parts that produces a joint that is held together by friction after the parts are pushed together.

The bottom heat spreader 140 is formed of a substance with high thermal conductivity (i.e., a thermal conductivity greater than one W/mK, such as any metal (e.g., copper), graphite, or graphene). Application of the bottom heat spreader 140 to the PCB 110 increases the surface area that radiates heat, increasing the ability of the memory sub-system 100 to dissipate heat and increasing the amount of heat that can be generated by the memory components before thermal throttling begins. Additionally, application of the bottom heat spreader 140 to other components that generate less heat allows transference of heat to those other components, further increasing the amount of heat that can be generated by the memory components before thermal throttling begins.

Figure 2:
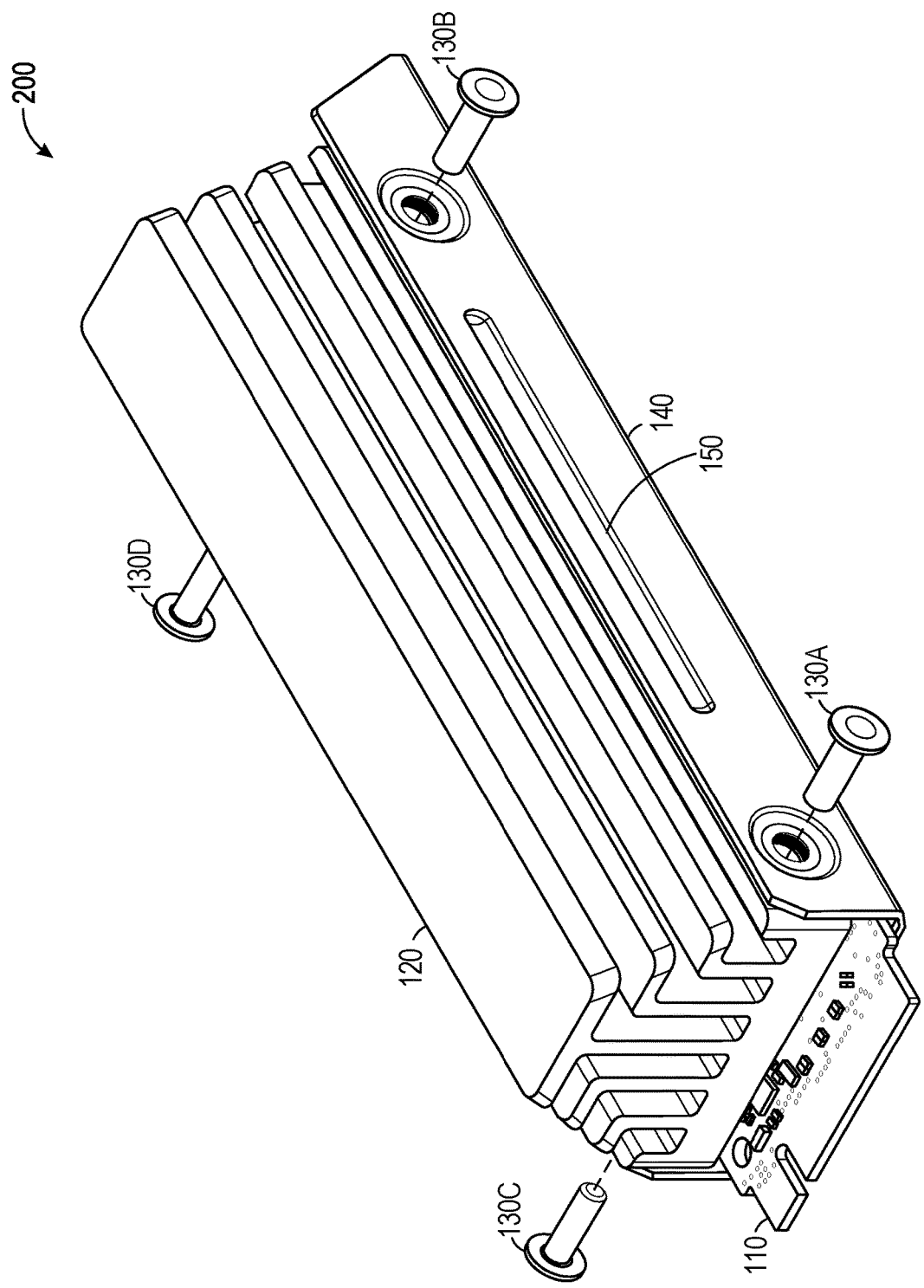
FIG. 2 illustrates the example memory sub-system, with a bottom heat spreader fastened to a top heatsink.

FIG. 2 illustrates the example memory sub-system 100 in a closed view 200, with the bottom heat spreader 140 fastened to the top heatsink 120. The feature 150 is coupled to the feature 160, hiding the feature 160 from view.

Figure 3:
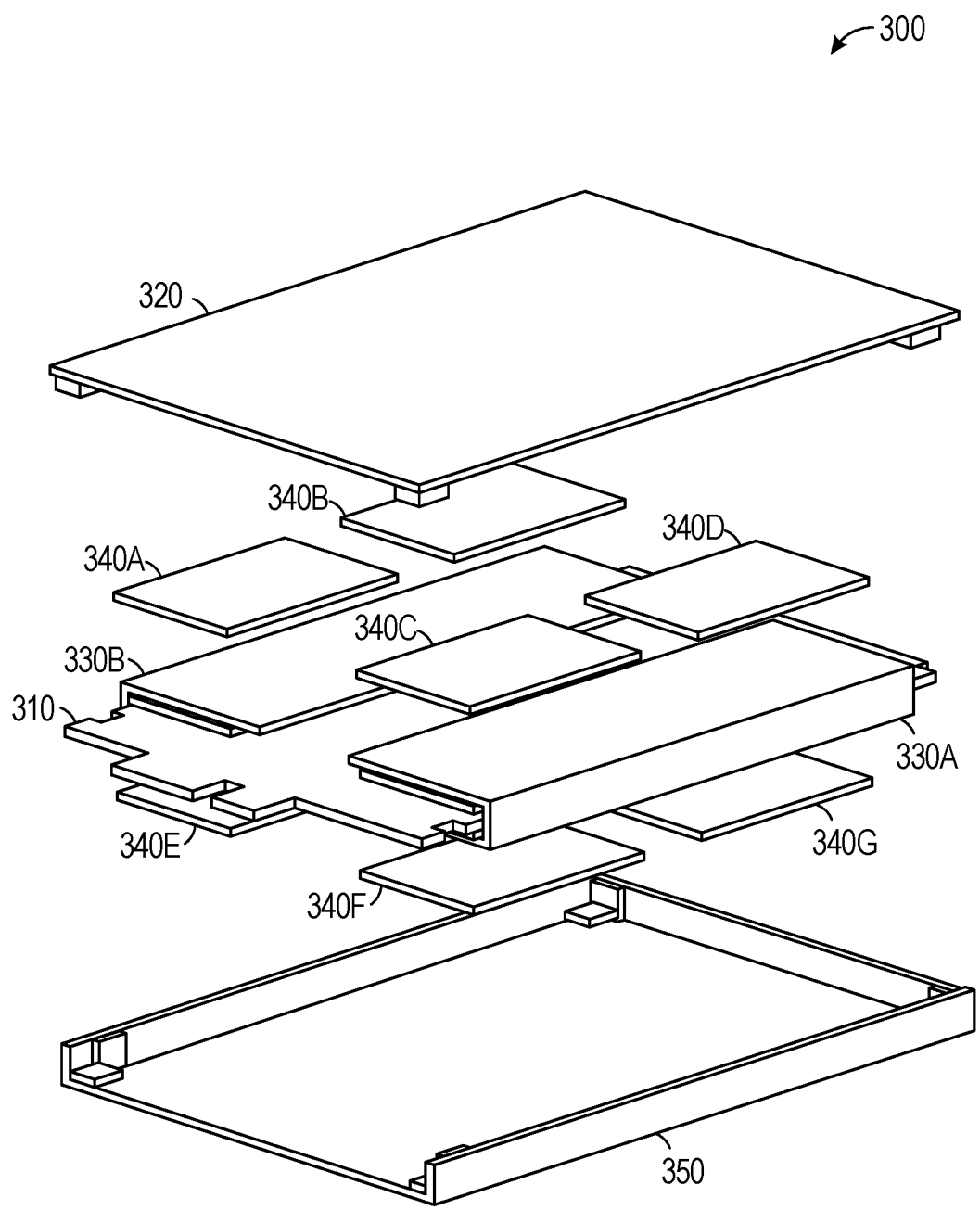
FIG. 3 illustrates another example memory sub-system in accordance with some embodiments of the present disclosure, in an exploded view.

FIG. 3 illustrates example memory sub-system 300 in accordance with some embodiments of the present disclosure, in an exploded view. The memory sub-system 300 includes a PCB 310, a top enclosure 320, heatsinks 330A and 330B, thermal gap pads 340A, 340B, 340C, 340D, 340E, 340F, and 340G, and a bottom enclosure 350. As discussed with respect to the PCB 110 of FIG. 1, the PCB 310 may include memory components and a controller and be configured to perform memory operations for a host. The top enclosure 320 and the bottom enclosure 350 may be composed of a material with high thermal conductivity.

The top enclosure 320 may transfer heat from the top side of the PCB 310 to the environment. The bottom enclosure 350 may transfer heat from the bottom side of the PCB 310 to the environment. If one side of the PCB 310 generates more heat than the other, or if, due to environmental considerations (e.g., the memory sub-system 300 being placed on a wooden desk) the heat transfer rate from one of the enclosures 320, 350 is faster than the heat transfer rate from the other, a temperature imbalance between the two sides of the PCB 310 may result. Once any component on the PCB 310 exceeds its operating temperature range, the results of operations performed by the PCB 310 will cease to be reliable. Accordingly, balancing the temperature of the top and bottom of the PCB 310 will help ensure reliable operation of the memory sub-system 300.

The heatsinks 330A and 330B may be U-shaped vapor chamber heatsinks (e.g., titanium-based vapor chambers or copper-based vapor chambers) that effectively transfer heat between the top enclosure 320 and the bottom enclosure 350. The heatsinks 330A-330B may be 0.3 mm thick. One side of each heatsink 330A, 330B may be in contact with one side of the PCB 310 and the other side of each heatsink 330A, 330B may be in contact with the other side of the PCB 310. Thus, the heatsinks 330A-330B may be configured to transfer heat between the two sides of the PCB 310. The heatsinks 330A-330B may have thermal conductivities greater than 1000 W/mK.

The thermal gap pads 340A-340G are made of a thermally conductive material and thermally couple the heatsinks 330A-330B to the top enclosure 320 and the bottom enclosure 350. For example, the size of the enclosure may be larger than the size of the PCB 310 in combination with the heatsinks 330A-330B. Using a thermally conductive material to couple the heatsinks 330A-330B to top enclosure 320 and the bottom enclosure 350 allows for the efficient transfer of heat from the heatsinks 330A-330B to the enclosure. The thermal coupling of the heatsinks 330A-330B to the top enclosure 320 or the bottom enclosure 350 may be accomplished by placing a thermal gap pad in contact with a heatsink and the top or bottom enclosure.

Figure 4:
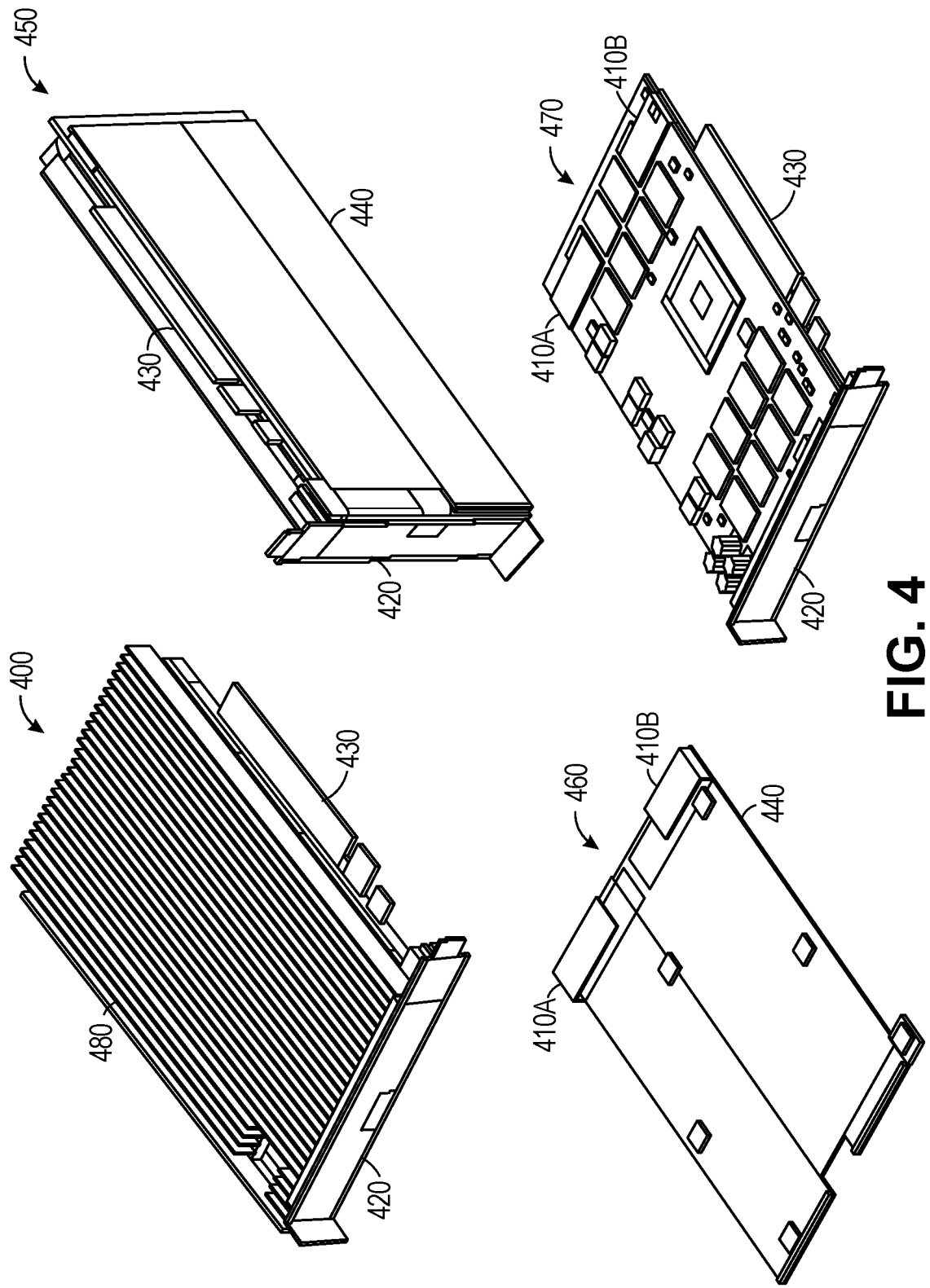
FIG. 4 illustrates views of an example memory sub-system in accordance with some embodiments of the present disclosure.

FIG. 4 illustrates views 400, 450, 460, and 470 of an example memory sub-system in accordance with some embodiments of the present disclosure. The view 460 shows a bottom cover 440 to which U-shaped vapor chambers 410A and 410B are affixed. The view 470 shows the PCB 430 added to the bottom cover 440 and between the arms of the U's of the U-shaped vapor chambers 410A and 410B. Thus, the U-shaped vapor chambers 410A and 410B convey heat from the warmer side of the PCB 430 to the cooler side of the PCB 430, helping reduce the maximum temperature within the memory sub-system. The view 470 also shows the I/O bracket 420 (e.g., a PCI I/O bracket). The I/O bracket 420 may be used to mount the memory sub-system to a chassis for coupling with a host device.

The view 400 shows top heatsink 480 covering the PCB 430 and connected to the I/O bracket 420 and the bottom cover 440. The top heatsink 480 comprises a plurality of fins, increasing the surface area of the top heatsink 480 and allowing for more rapid dissipation of heat into the environment. The top heatsink 480 and the bottom cover 440 are in contact with the U-shaped vapor chambers 410A and 410B, allowing heat to be radiated out of the memory sub-system. The enclosure is configured to transfer heat from the bottom cover 440 to the top heatsink 480. The view 450 shows the same elements as the view 400, from a different angle. By comparison with memory sub-systems lacking the U-shaped vapor chambers 410A and 410B, heat is radiated from the memory sub-system of FIG. 4 more effectively. For example, the bottom cover 440 may be in contact with an insulator or still air while the top heatsink 480 is placed in a path of moving air. Without the U-shaped vapor chambers 410A and 410B, the heat from the bottom of the PCB 430 and the bottom cover 440 will not be discharged through the top heatsink 480, possibly causing thermal failure of components of the PCB 430. With the U-shaped vapor chambers 410A and 410B, the heat from the bottom of the PCB 430 and the bottom cover 440 is transferred to the top heatsink 480, allowing the moving air to pass over the fins of the top heatsink 480 and transfer heat out of the memory sub-system. The U-shaped vapor chambers 410A-410B may be embedded in the bottom cover 440.

Figure 5:
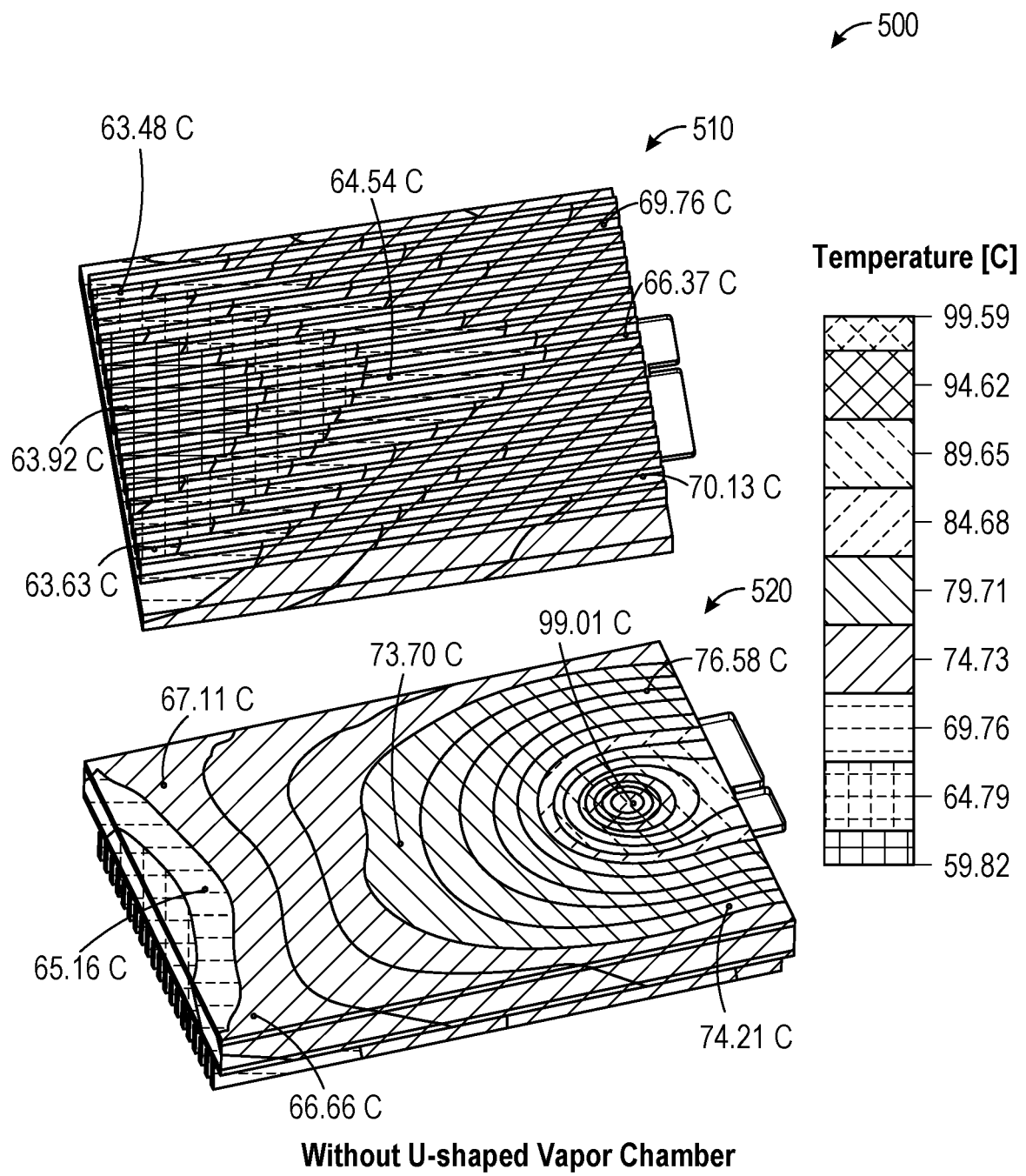
FIG. 5 illustrates heat distribution on a memory sub-system that does not use heat mitigation technologies discussed herein.

FIG. 5 illustrates heat distribution on a memory sub-system 500 that does not use heat mitigation technologies discussed herein. Heat distribution 510 is a top view and heat distribution 520 is a bottom view. The peak temperature in the heat distribution 510 is about 70° C. while the peak temperature in the heat distribution 520 is about 99° C. Without a mechanism for transferring heat from one side of the memory sub-system 600 to the other, the temperature difference between the two sides is nearly 30° C.

Figure 6:
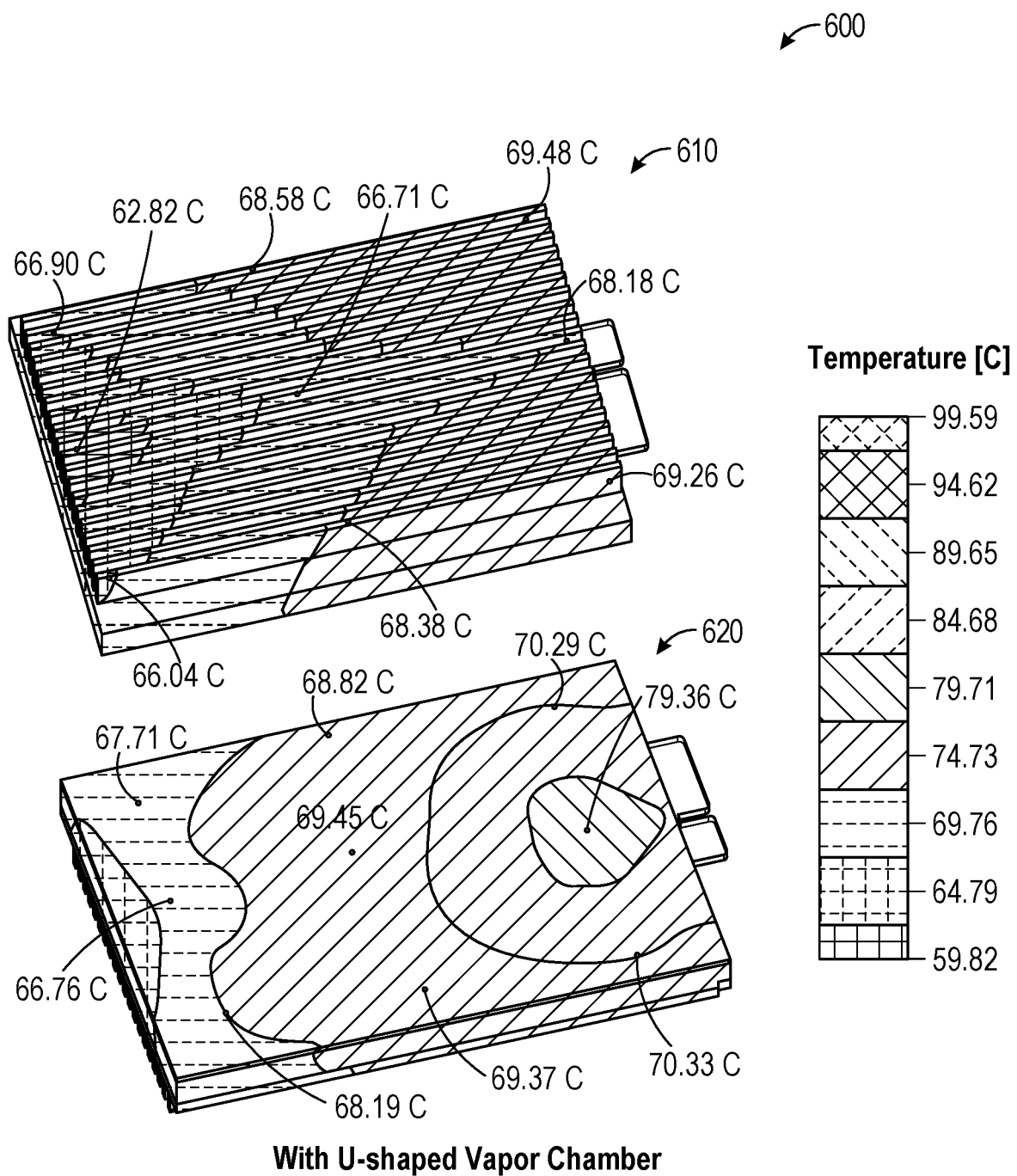
FIG. 6 illustrates heat distribution on a memory sub-system that uses heat mitigation technologies discussed herein.

FIG. 6 illustrates heat distribution on a memory sub-system 600 that uses heat mitigation technologies discussed herein. Heat distribution 610 is a top view and heat distribution 620 is a bottom view. The peak temperature in the heat distribution 610 is about 69° C. while the peak temperature in the heat distribution 620 is about 79° C. Because heat is transferred between the two sides of the memory sub-system 600, the temperature difference between the two sides is only about 10° C.

Figure 7:
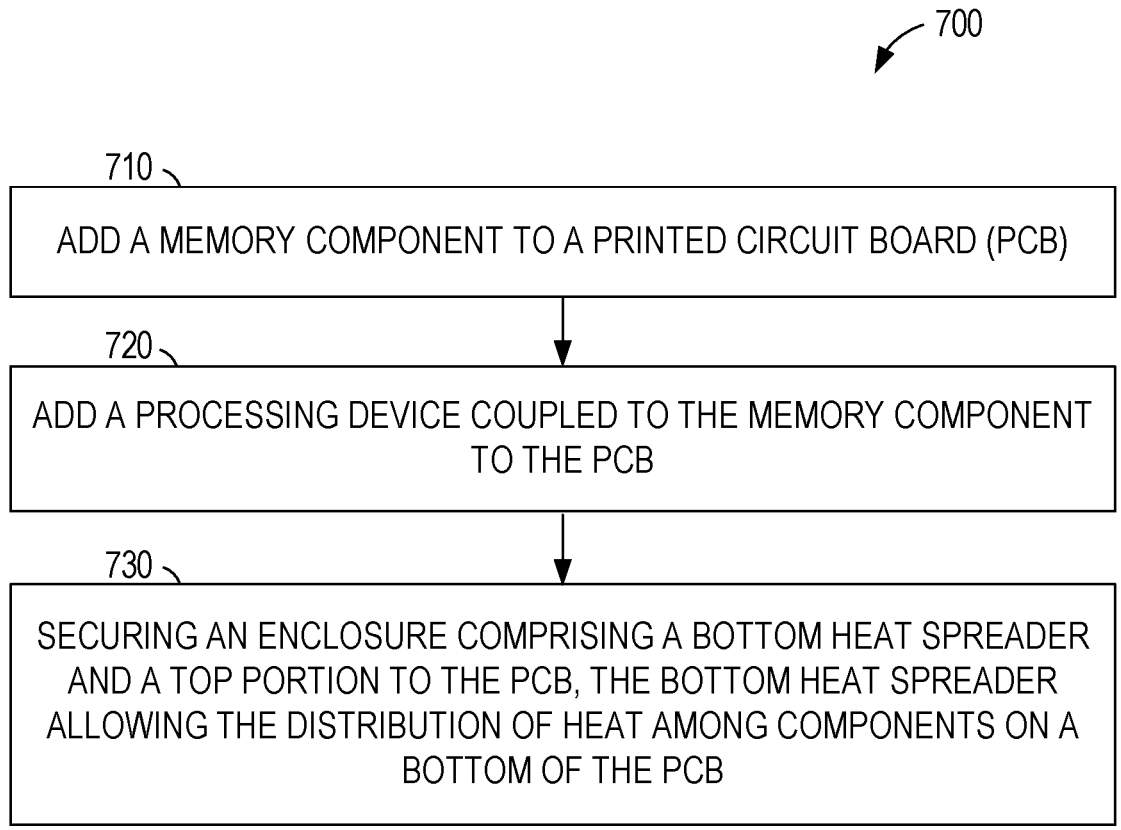
FIG. 7 is a flow diagram of an example method to assemble a memory sub-component that uses heat mitigation technologies, in accordance with some embodiments of the present disclosure.

FIG. 7 is a flow diagram of an example method 700 to assemble a memory sub-system that uses heat mitigation technologies, in accordance with some embodiments of the present disclosure. The method 700 includes steps 710, 720, and 730.

In step 710, a memory component is added to a PCB. For example, the memory component 170 may be soldered to the PCB 110, both of FIG. 1. A processing device coupled to the memory component is added to the PCB in step 720. For example, an external memory controller may be added to the PCB 110 and coupled to the memory component 170 to control memory access operations.

An enclosure comprising a bottom heat spreader and a top portion is secured to the PCB in step 730. The bottom heat spreader allows the distribution of heat among components on a bottom of the PCB. For example, the enclosure of FIG. 1, comprising the bottom heat spreader 140 and the top heatsink 120, may be secured to the PCB 110. As another example, the enclosure of FIG. 3, comprising the bottom enclosure 350 and the top enclosure 320, may be secured to the PCB 310.

To better illustrate the methods and apparatuses described herein, a non-limiting set of Example embodiments are set forth below as numerically identified Examples.

Example 1 is a memory sub-system, comprising: a printed circuit board (PCB); a memory component connected to the PCB; a processing device connected to the PCB and operably coupled to the memory component; and an enclosure comprising a bottom heat spreader and a top portion, the bottom heat spreader allowing distribution of heat among components on a bottom of the PCB.

In Example 2, the subject matter of Example 1, wherein the enclosure further comprises: a plurality of fasteners connecting the bottom heat spreader and the top portion, the fasteners configured to conduct heat between the bottom heat spreader and the top portion.

In Example 3, the subject matter of Example 2, wherein the bottom heat spreader comprises a feature that creates an interference fit with the top portion once the plurality of fasteners are tightened, the interference fit configured to conduct heat between the bottom heat spreader and the top portion.

In Example 4, the subject matter of Examples 1-3 includes a titanium-based vapor chamber configured to transfer heat between the bottom heat spreader and the top portion of the enclosure.

In Example 5, the subject matter of Example 4 includes a thermal gap pad in contact with the vapor chamber and the top portion.

In Example 6, the subject matter of Examples 4-5, wherein the titanium-based vapor chamber is a U-shaped 0.3 mm thick titanium-based vapor chamber.

In Example 7, the subject matter of Examples 1-6 includes a peripheral component interconnect (PCI) input/output (I/O) bracket.

In Example 8, the subject matter of Examples 1-7, wherein the memory sub-system is a solid state drive (SSD).

In Example 9, the subject matter of Examples 1-8, wherein the enclosure is configured to transfer heat from the bottom heat spreader to the top portion.

In Example 10, the subject matter of Examples 1-9, wherein the top portion comprises a plurality of fins configured to radiate heat into an environment of the memory sub-system.

Example 11 is a method of manufacturing a memory sub-system comprising: adding a memory component to a printed circuit board (PCB); adding a processing device coupled to the memory component to the PCB; and securing an enclosure comprising a bottom heat spreader and a top portion to the PCB, the bottom heat spreader allowing distribution of heat among components on a bottom of the PCB.

In Example 12, the subject matter of Example 11, wherein the enclosure further comprises: a plurality of fasteners connecting the bottom heat spreader and the top portion, the fasteners configured to conduct heat between the bottom heat spreader and the top portion.

In Example 13, the subject matter of Example 12, wherein the bottom heat spreader comprises a feature that creates an interference fit with the top portion once the plurality of fasteners are tightened, the interference fit configured to conduct heat between the bottom heat spreader and the top portion.

In Example 14, the subject matter of Examples 11-13 includes, before securing the enclosure, placing a titanium-based vapor chamber configured to transfer heat between the bottom heat spreader and the top portion of the enclosure.

In Example 15, the subject matter of Example 14 includes placing a thermal gap pad in contact with the vapor chamber and the top portion.

In Example 16, the subject matter of Examples 14-15 wherein the titanium-based vapor chamber is a U-shaped 0.3 mm thick titanium-based vapor chamber.

In Example 17, the subject matter of Examples 11-16 includes securing a peripheral component interconnect (PCI) input/output (I/O) bracket to the PCB.

In Example 18, the subject matter of Examples 11-17, wherein the memory sub-system is a solid state drive (SSD).

In Example 19, the subject matter of Examples 11-18, wherein the enclosure is configured to transfer heat from the bottom heat spreader to the top portion.

In Example 20, the subject matter of Examples 11-19, wherein the top portion comprises a plurality of fins configured to radiate heat into an environment of the memory sub-system.

Example 21 is at least one machine-readable medium including instructions that, when executed by processing circuitry, cause the processing circuitry to perform operations to implement any of Examples 1-20.

Example 22 is an apparatus comprising means to implement any of Examples 1-20.

Example 23 is a system to implement any of Examples 1-20.

Example 24 is a method to implement any of Examples 1-20.

FIG. 8 illustrates an example machine of a computer system 800 within which a set of instructions can be executed for causing the machine to perform any one or more of the methodologies discussed herein. In some embodiments, the computer system 800 can correspond to a host system that includes, is coupled to, or utilizes a memory sub-system (e.g., the memory sub-system 100 of FIG. 1) or can be used to perform the operations of a controller (e.g., to execute an operating system to execute instructions 824 for reading a physical address using a write temperature data and/or generating a write temperature data while writing to a physical address). The instructions 824 may include, for example, instructions 824 and/or logic described herein. In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

FIG. 8 illustrates a block diagram of an example machine 800 with which, in which, or by which any one or more of the techniques (e.g., methodologies) discussed herein can be implemented. Examples, as described herein, can include, or can operate by, logic or a number of components, or mechanisms in the machine 800. Circuitry (e.g., processing circuitry) is a collection of circuits implemented in tangible entities of the machine 800 that include hardware (e.g., simple circuits, gates, logic, etc.). Circuitry membership can be flexible over time. Circuitries include members that can, alone or in combination, perform specified operations when operating. In an example, hardware of the circuitry can be immutably designed to carry out a specific operation (e.g., hardwired). In an example, the hardware of the circuitry can include variably connected physical components (e.g., execution units, transistors, simple circuits, etc.) including a machine-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware via the variable connections to carry out portions of the specific operation when in operation. Accordingly, in an example, the machine-readable medium elements are part of the circuitry or are communicatively coupled to the other components of the circuitry when the device is operating. In an example, any of the physical components can be used in more than one member of more than one circuitry. For example, under operation, execution units can be used in a first circuit of a first circuitry at one point in time and reused by a second circuit in the first circuitry, or by a third circuit in a second circuitry at a different time. Additional examples of these components with respect to the machine 800.

In alternative embodiments, the machine 800 can operate as a standalone device or can be connected (e.g., networked) to other machines. In a networked deployment, the machine 800 can operate in the capacity of a server machine, a client machine, or both in server-client network environments. In an example, the machine 800 can act as a peer machine in peer-to-peer (P2P) (or other distributed) network environment. The machine 800 can be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

The machine 800 (e.g., computer system) can include a hardware processor 802 (e.g., a central processing unit (CPU), a graphics processing unit (GPU), a hardware processor core, or any combination thereof), a main memory 804, a static memory 806 (e.g., memory or storage for firmware, microcode, a basic-input-output (BIOS), unified extensible firmware interface (UEFI), etc.), and mass storage device 808 (e.g., hard drives, tape drives, flash storage, or other block devices) some or all of which can communicate with each other via an interlink 830 (e.g., bus). The machine 800 can further include a display device 810, an alphanumeric input device 812 (e.g., a keyboard), and a user interface (UI) navigation device 814 (e.g., a mouse). In an example, the display device 810, the input device 812, and the UI navigation device 814 can be a touch screen display. The machine 800 can additionally include a signal generation device 818 (e.g., a speaker), a network interface device 820, and one or more sensor(s) 816, such as a global positioning system (GPS) sensor, compass, accelerometer, or other sensor. The machine 800 can include an output controller 828, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

Registers of the hardware processor 802, the main memory 804, the static memory 806, or the mass storage device 808 can be, or include, a machine-readable media 822 on which is stored one or more sets of data structures or instructions 824 (e.g., software) embodying or used by any one or more of the techniques or functions described herein. The instructions 824 can also reside, completely or at least partially, within any of registers of the hardware processor 802, the main memory 804, the static memory 806, or the mass storage device 808 during execution thereof by the machine 800. In an example, one or any combination of the hardware processor 802, the main memory 804, the static memory 806, or the mass storage device 808 can constitute the machine-readable media 822. While the machine-readable media 822 is illustrated as a single medium, the term "machine-readable medium" can include a single medium or multiple media (e.g., a centralized or distributed database, or associated caches and servers) configured to store the one or more instructions 824.

The term "machine readable medium" can include any medium that is capable of storing, encoding, or carrying instructions for execution by the machine 800 and that cause the machine 800 to perform any one or more of the techniques of the present disclosure, or that is capable of storing, encoding, or carrying data structures used by or associated with such instructions. Non-limiting machine-readable medium examples can include solid-state memories, optical media, magnetic media, and signals (e.g., radio frequency signals, other photon-based signals, sound signals, etc.). In an example, a non-transitory machine-readable medium comprises a machine-readable medium with a plurality of particles having invariant (e.g., rest) mass, and thus are compositions of matter. Accordingly, non-transitory machine-readable media are machine readable media that do not include transitory propagating signals. Specific examples of non-transitory machine-readable media can include: non-volatile memory, such as semiconductor memory devices (e.g., electrically programmable read-only memory (EPROM), electrically erasable programmable read-only memory (EEPROM)) and flash memory devices; magnetic disks, such as internal hard disks and removable disks; magneto-optical disks; and CD-ROM and DVD-ROM disks.

In an example, information stored or otherwise provided on the machine-readable media 822 can be representative of the instructions 824, such as instructions 824 themselves or a format from which the instructions 824 can be derived. This format from which the instructions 824 can be derived can include source code, encoded instructions (e.g., in compressed or encrypted form), packaged instructions (e.g., split into multiple packages), or the like. The information representative of the instructions 824 in the machine-readable media 822 can be processed by processing circuitry into the instructions to implement any of the operations discussed herein. For example, deriving the instructions 824 from the information (e.g., processing by the processing circuitry) can include: compiling (e.g., from source code, object code, etc.), interpreting, loading, organizing (e.g., dynamically or statically linking), encoding, decoding, encrypting, unencrypting, packaging, unpackaging, or otherwise manipulating the information into the instructions 824.

In an example, the derivation of the instructions 824 can include assembly, compilation, or interpretation of the information (e.g., by the processing circuitry) to create the instructions 824 from some intermediate or preprocessed format provided by the machine-readable media 822. The information, when provided in multiple parts, can be combined, unpacked, and modified to create the instructions 824. For example, the information can be in multiple compressed source code packages (or object code, or binary executable code, etc.) on one or several remote servers. The source code packages can be encrypted when in transit over a network and decrypted, uncompressed, assembled (e.g., linked) if necessary, compiled or interpreted (e.g., into a library, stand-alone executable etc.) at a local machine, and executed by the local machine.

The instructions 824 can be further transmitted or received over a communications network 826 using a transmission medium via the network interface device 820 utilizing any one of a number of transfer protocols (e.g., frame relay, internet protocol, transmission control protocol (TCP), user datagram protocol (UDP), hypertext transfer protocol (HTTP), etc.). Example communication networks can include a local area network (LAN), a wide area network (WAN), a packet data network (e.g., the Internet), mobile telephone networks (e.g., cellular networks), plain old telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 820 can include one or more physical jacks (e.g., Ethernet, coaxial, or phone jacks) or one or more antennas to connect to the network 826. In an example, the network interface device 820 can include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 800, and includes digital or analog communications signals or other intangible medium to facilitate communication of such software. A transmission medium is a machine readable medium.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory sub-system, comprising:
a printed circuit board (PCB);
a memory component connected to the PCB;
a processing device connected to the PCB and operably coupled to the memory component;
an enclosure comprising a bottom heat spreader and a top portion, the bottom heat spreader allowing distribution of heat among components on a bottom of the PCB; and
a titanium-based vapor chamber configured to transfer heat between the bottom heat spreader and the top portion of the enclosure.

2. The memory sub-system of claim 1, wherein the enclosure further comprises:
a plurality of fasteners connecting the bottom heat spreader and the top portion, the fasteners configured to conduct heat between the bottom heat spreader and the top portion.

3. The memory sub-system of claim 2, wherein the bottom heat spreader comprises a feature that creates an interference fit with the top portion once the plurality of fasteners are tightened, the interference fit configured to conduct heat between the bottom heat spreader and the top portion.

4. The memory sub-system of claim 1, further comprising:
a thermal gap pad in contact with the vapor chamber and the top portion.

5. The memory sub-system of claim 1, wherein the titanium-based vapor chamber is a U-shaped 0.3 mm thick titanium-based vapor chamber.

6. The memory sub-system of claim 1, further comprising:
a peripheral component interconnect (PCI) input/output (I/O) bracket.

7. The memory sub-system of claim 1, wherein the memory sub-system is a solid state drive (SSD).

8. The memory sub-system of claim 1, wherein the enclosure is configured to transfer heat from the bottom heat spreader to the top portion.

9. The memory sub-system of claim 1, wherein the top portion comprises a plurality of fins configured to radiate heat into an environment of the memory sub-system.

10. The memory sub-system of claim 1, wherein the titanium-based vapor chamber has a thermal conductivity greater than 1000 W/mK.

11. A method of manufacturing a memory sub-system comprising:
adding a memory component to a printed circuit board (PCB);
adding a processing device coupled to the memory component to the PCB;
placing a titanium-based vapor chamber configured to transfer heat between a bottom heat spreader a top portion of an enclosure; and
securing the enclosure comprising the bottom heat spreader and the top portion to the PCB, the bottom heat spreader allowing distribution of heat among components on a bottom of the PCB.

12. The method of claim 11, wherein the enclosure further comprises:
a plurality of fasteners connecting the bottom heat spreader and the top portion, the fasteners configured to conduct heat between the bottom heat spreader and the top portion.

13. The method of claim 12, wherein the bottom heat spreader comprises a feature that creates an interference fit with the top portion once the plurality of fasteners are tightened, the interference fit configured to conduct heat between the bottom heat spreader and the top portion.

14. The method of claim 11, further comprising:
placing a thermal gap pad in contact with the vapor chamber and the top portion.

15. The method of claim 11, wherein the titanium-based vapor chamber is a U-shaped 0.3 mm thick titanium-based vapor chamber.

16. The method of claim 11, further comprising:
securing a peripheral component interconnect (PCI) input/output (I/O) bracket to the PCB.

17. The method of claim 11, wherein the memory sub-system is a solid state drive (SSD).

18. The method of claim 11, wherein the enclosure is configured to transfer heat from the bottom heat spreader to the top portion.

19. The method of claim 11, wherein the top portion comprises a plurality of fins configured to radiate heat into an environment of the memory sub-system.

20. The method of claim 11, wherein the titanium-based vapor chamber has a thermal conductivity greater than 1000 W/mK.

* * * * *